United States Patent
Valverde et al.

(10) Patent No.: US 7,332,193 B2
(45) Date of Patent: *Feb. 19, 2008

(54) COBALT AND NICKEL ELECTROLESS PLATING IN MICROELECTRONIC DEVICES

(75) Inventors: Charles Valverde, Ansonia, CT (US); Nicolai Petrov, Hamden, CT (US); Eric Yakobson, Aliso Viejo, CA (US); Qingyun Chen, Branford, CT (US); Vincent Paneccasio, Jr., Madison, CT (US); Richard Hurtubise, Clinton, CT (US); Christian Witt, Woodbridge, CT (US)

(73) Assignee: Enthone, Inc., West Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/085,304

(22) Filed: Mar. 21, 2005

(65) Prior Publication Data

US 2006/0083850 A1    Apr. 20, 2006

Related U.S. Application Data

(60) Provisional application No. 60/619,728, filed on Oct. 18, 2004.

(51) Int. Cl.
*C23C 18/16* (2006.01)
*C23C 18/36* (2006.01)
*C23C 18/32* (2006.01)

(52) U.S. Cl. .................. 427/99.5; 427/437; 427/443.1

(58) Field of Classification Search ............... 427/99.5, 427/443.1, 437
See application file for complete search history.

(56) References Cited

U.S. PATENT DOCUMENTS

| | | | |
|---|---|---|---|
| 2,430,581 A | 11/1947 | Pessel | |
| 2,532,284 A | 12/1950 | Brenner et al. | |
| 3,032,436 A | 5/1962 | Gostin et al. | |
| 3,234,031 A | 2/1966 | Zimgiebl | |
| 3,416,955 A | 12/1968 | Makowski | |
| 3,893,865 A * | 7/1975 | Franz et al. | 106/1.27 |
| 4,695,489 A | 9/1987 | Zarnoch et al. | |
| 4,770,899 A | 9/1988 | Zeller | |
| 4,863,766 A | 9/1989 | Iacovangelo et al. | |
| 5,169,680 A | 12/1992 | Ting et al. | |
| 5,240,497 A | 8/1993 | Shacham et al. | |
| 5,674,787 A | 10/1997 | Zhao et al. | |
| 5,695,810 A | 12/1997 | Dubin et al. | |
| 5,891,513 A | 4/1999 | Dubin et al. | |
| 6,060,176 A | 5/2000 | Semkow et al. | |

(Continued)

OTHER PUBLICATIONS

L. Cadorna et al., "Electroless Plating—II. Electroless Cobalt from Alkaline Sulfamate Bath", Institute for Electrochemistry, Physical Chemistry and Metallurgy, Polytechnic, Milan, pp. 177-190.

(Continued)

*Primary Examiner*—Katherine Bareford
(74) *Attorney, Agent, or Firm*—Senniger Powers

(57) ABSTRACT

An electroless plating method and composition for depositing Co, Ni, or alloys thereof onto a metal-based substrate in manufacture of microelectronic devices, involving a source of deposition ions selected from the group consisting of Co ions and Ni ions, a reducing agent for reducing the depositions ions to metal onto the substrate, and a hydrazine-based leveling agent.

17 Claims, 1 Drawing Sheet

U.S. PATENT DOCUMENTS

| | | |
|---|---|---|
| 6,106,927 A | 8/2000 | Zhong et al. |
| 6,297,146 B1 | 10/2001 | Lopatin |
| 6,410,104 B1 | 6/2002 | Zhong et al. |
| 6,528,185 B2 | 3/2003 | Man et al. |
| 6,680,540 B2 | 1/2004 | Nakano et al. |
| 6,709,561 B1 | 3/2004 | Pavlov et al. |
| 6,714,618 B1 | 3/2004 | Hettiarachchi et al. |
| 6,774,049 B2 | 8/2004 | Klein |
| 6,780,456 B2 | 8/2004 | Kunishi et al. |
| 6,797,312 B2 * | 9/2004 | Kong et al. ............ 427/58 |
| 6,902,605 B2 | 6/2005 | Kolics et al. |
| 2003/0207560 A1 | 11/2003 | Dubin et al. |
| 2004/0022934 A1 * | 2/2004 | Leung et al. ........... 427/98 |

OTHER PUBLICATIONS

G. Mallory et al., "Electroless Plating Fundamentals and Applications", American Electroplaters and Surface Finishers Society, Inc., pp. 4-27, 482-483.

* cited by examiner

COBALT AND NICKEL ELECTROLESS PLATING IN MICROELECTRONIC DEVICES

REFERENCE TO RELATED APPLICATION

This application is based on provisional application Ser. No. 60/619,728, filed Oct. 18, 2004, which is incorporated herein by reference.

FIELD OF THE INVENTION

This invention relates to electroless plating of Co, Ni, and alloys thereof in microelectronic device applications.

BACKGROUND OF THE INVENTION

Electroless deposition of Co, Ni, and alloys thereof is employed in a variety of applications in the manufacture of microelectronic devices. For example, it is known to deposit a Co-based cap on interconnect metallization. In particular, in damascene processing, metallization is employed to form electrical interconnects in an integrated circuit substrate by metal-filling of interconnect features such as vias and trenches formed in the substrate.

If metal deposited on an integrated circuit substrate is Cu, it can diffuse rapidly into the Si substrate and dielectric films such as, for example, $SiO_2$ or low k dielectrics. Copper can also diffuse into a device layer built on top of a substrate in multilayer device applications. Such diffusion can be detrimental to the device because it can cause electrical leakage in substrates, or form an unintended electrical connection between two interconnects resulting in an electrical short. Moreover, Cu diffusion out of an interconnect feature can disrupt electrical flow there through.

Metal deposited on an integrated circuit substrate also has a tendency to migrate when electrical current passes through interconnect features in service. Electron flux moves the metal atoms from one place of the interconnect feature, creating the void, and moves them to the different location, forming hillock. This migration can damage an adjacent interconnect line, and disrupt electrical flow in the feature from which the metal migrates.

After metal-filling of interconnect features, chemical mechanical polishing is employed to planarize and smooth the metallization deposited within the interconnect features. See, for example, Dubin et al. (U.S. Pat. No. 5,891,513) (describing CMP).

Accordingly, among the challenges facing integrated circuit device manufacturers is to minimize diffusion and electromigration of metal out of metal-filled interconnect features. This challenge becomes more acute as the devices further miniaturize, and as the features further miniaturize and densify.

Another challenge in the context of metal interconnect features is to protect them from corrosion. Certain interconnect metals, especially Cu, are more susceptible to corrosion.

Copper is a fairly reactive metal which readily oxidizes under ambient conditions. This reactivity can undermine adhesion to dielectrics and thin films, resulting in voids and delamination. Another challenge is therefore to combat oxidation and enhance adhesion between the cap and the Cu, and between structure layers.

To address these challenges the industry has employed a variety of diffusion barrier layers as caps over Cu and other metal interconnect features. Electroless Co and Ni have been discussed as protective layers over electrical interconnect lines in, for example, U.S. patent publication number 2003/0207560.

A particular cobalt-based metal capping layer employed to reduce Cu migration, provide corrosion protection, and enhance adhesion between the dielectric and Cu is a ternary alloy including cobalt, tungsten, and phosphorus. See Dubin et al. (U.S. Pat. No. 5,695,810) (Co—W—P as a barrier material on a semiconductor wafer). Another refractory metal may replace or be used in addition to tungsten, and boron is often substituted for or used in addition to phosphorus. Each component of the ternary alloy imparts advantages to the protective layer.

A particular problem associated with diffusion barrier layers is roughness of the layer surface. Roughness can entrap contaminants during wet processing, cause defects and voids thereby promoting electromigration failure, affect the signal propagation across the circuitry, and promote nodular, dendritic growth of the electroless deposit at the barrier/Cu interface, which can significantly reduce selectivity of the capping layer, increase current leakage, and in extreme cases even result in electrical shorts.

Generally, electroless deposition solutions deposit a capping layer that amplifies roughness of the underlying copper interconnect topography, giving a rough, nodular deposit in the capping layer. Although CMP is often performed on the Cu interconnect features, some roughness persists on the Cu surface, which is then amplified by the cap.

Therefore, there exists a need for smoother electrolessly deposited capping layers over Cu interconnects. There is a particular need for an electroless deposition method and solution which can improve the topography and morphology of an electroless deposit and result in a significantly smoother electroless layer.

SUMMARY OF THE INVENTION

Among the objects of the invention are to provide a method and compositions for Co and/or Ni electroless plating which yields a level deposit; and to provide a method and compositions for Co and/or Ni electroless plating which is suitable for use in capping applications in microelectronic devices; etc.

Briefly, therefore, the invention is directed a composition for metal plating which comprises a source of deposition ions selected from the group consisting of Co ions and Ni ions, a reducing agent, and a hydrazine-based leveling agent.

The invention is also directed to a method for electrolessly depositing Co, Ni, or alloys thereof onto a metal-based substrate in manufacture of microelectronic devices. The method comprises contacting the metal-based substrate with an electroless deposition composition comprising a hydrazine-based leveling agent and a source of deposition ions selected from the group consisting of Co ions and Ni ions.

Other objects and features of the invention will be in part apparent and in part pointed out hereinafter.

DETAILED DESCRIPTION OF PREFERRED EMBODIMENTS

Figure 1:
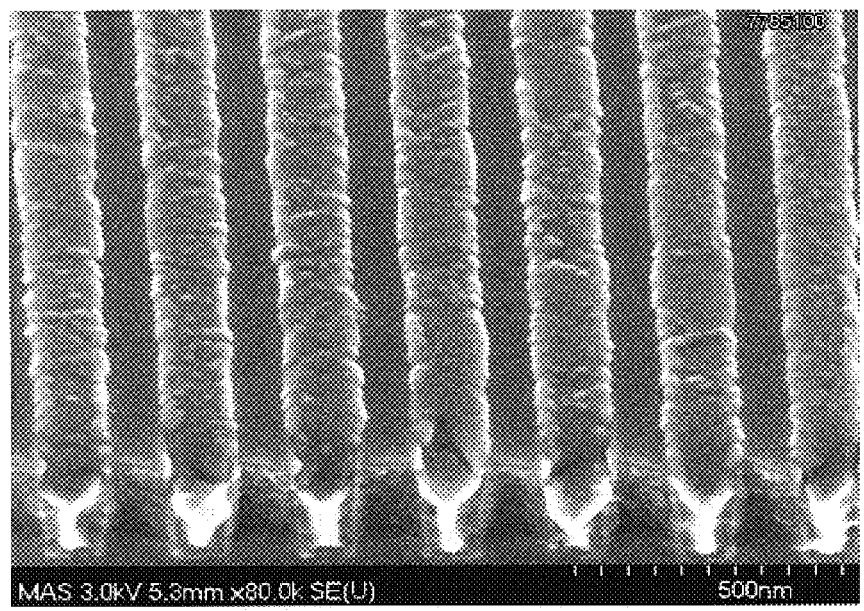
FIG. 1 is a SEM photograph of a Co—W—P diffusion protection layer not of the invention magnified 80,000×.

In accordance with the invention, Co and/or Ni are deposited using methods and compositions which yield a deposit of enhanced smoothness and greater planarity. For example, a smooth electroless diffusion barrier layer can be electrolessly deposited over an interconnect feature in a microelectronic device. Such interconnect feature may be filled with Cu metallization, for example. The electroless deposition method and composition of the invention have been shown to achieve a deposit having a surface roughness on the order of about 5 Angstroms in a deposit having a thickness on the order of about 150 Angstroms.

The present invention stems from the discovery that free hydrazine acts as a leveler and stabilizer in Co- and Ni-based electroless plating baths for plating on metal substrates in the manufacture of microelectronic devices. Accordingly, the invention employs a hydrazine-based leveling agent, i.e., a source of hydrazine or hydrazine derivative that introduces free hydrazine upon dissolution into a Co- or Ni-based electroless plating baths for plating on metal substrates in the manufacture of microelectronic devices. Examples of preferred sources of hydrazine include hydrazine, hydrazine hydrate, hydrazine sulfate, hydrazine chloride, hydrazine bromide, hydrazine dihydrochloride, hydrazine dihydrobromide and hydrazine tartrate. These sources are preferred in certain embodiments of the invention because they provide hydrazine directly upon dissolution. Other suitable sources of hydrazine include 2-hydrazinopyridine, hydrazobenzene, phenyl hydrazine, hydrazine-N,N-diacetic acid, 1,2-diethylhydrazine, monomethylhydrazine, 1,1-, 1,2-dimethylhydrazine, 4-hydrazinobenzenesulfonic acid, hydrazinecarboxylic acid, 2-hydrazinoethanol, semicarbazide, carbohydrazide, aminoguanidine hydrochloride, 1,3-diaminoguanidine monohydrochloride, and triaminoguanidine hydrochloride. These sources provide hydrazine as a reaction product.

Hydrazine has been discussed as a reducing agent in electroless plating baths. See Mallory, Glenn O. and Hajdu, Juan B., Electroless Plating Fundamentals and Applications, pp. 4-26. Hydrazine as a reducing agent is required in high concentrations, such as between about 1 M and about 2 M, which is about 32 g/L to about 64 g/L. The bath is also kept at a strongly alkaline pH and plating occurs at high temperatures. See Mallory and Hajdu, pp. 482-483 (1 M hydrazine, plating at pH 12 and 90° C.), Makowski (U.S. Pat. No. 3,416,955) (2.0 to 4.0 M hydrazine, optimum plating at pH 10 to 11 and 80° C. to 90° C.), and Zarnoch et al. (U.S. Pat. No. 4,695,489) (2 M hydrazine, plating at pH 10 to 13 and preferred temperature between 93° C. to 97° C).

According to the present invention, hydrazine's primary role is not that of a reducing agent. In the baths of the invention, the concentration of hydrazine is kept low and the bath is held under milder conditions of pH and temperature. Under such conditions, hydrazine acts as a leveler of the deposit and as a stabilizer of the deposition. This result is surprising and counter-intuitive because at high concentrations and under certain plating conditions, hydrazine is a potent reducing agent. It would be expected that increasing the concentration of hydrazine should enhance the plating rate. In fact, it has been found that within the composition, mild pH range, and temperature ranges of the present invention, a hydrazine concentration that is too high suppresses the plating rate and increases the time to deposition initiation.

Therefore, according to the plating baths of the present invention, the hydrazine or its derivatives are added to the bath in a relatively low concentration range of 0.01-10,000 ppm (w/w), preferably from about 1 to about 1000 ppm, more preferably from about 5 to about 500 ppm. In one preferred embodiment, hydrazine is maintained in the range of between about 1 ppm and 200 ppm. In another embodiment, it is maintained between about 1 and about 100 ppm, for example, between about 10 and about 20 ppm. For hydrazine, 1 Molar is 32 g/L; 0.01 Molar is 320 mg/L, or 320 ppm (w/w); 100 ppm hydrazine equals about 0.0031 Molar. At these low concentrations, hydrazine alone could not reduce Co ions to Co metal to any appreciable extent. Further, the baths are kept within a mildly alkaline pH range from 7.5 to 10, typically between about 8.2 and about 10. In one preferred bath, the pH is between about 8.7 and about 9.3. At a pH below about 7.5, cobalt reduction fails to initiate or initiates only slowly, and at an acidic pH, cobalt ions are not reduced at all. At a pH more alkaline than about 10, the plating rate is too high, and the bath becomes unstable. Plating typically occurs at a bath temperature of between about 65° C. to about 90° C. In one embodiment, plating occurs at 80° C. If the plating temperature is too low, i.e., below about 60° C., the reduction rate is too slow, and at a low enough temperature, Co reduction does not initiate at all. At too high a temperature, the plating rate increases, and the bath becomes too active. For example, Co reduction becomes less selective, and Co plating may occur not just on the Cu interconnect features of a wafer substrate, but also on the dielectric material. Further, at very high temperatures, Co reduction occurs spontaneously in the bulk of the solution and on the sidewalls of the plating tank.

Although the leveling mechanism of hydrazine is not entirely understood, it is known that higher concentrations of the levelers slow down the overall deposition rate of the electroless film. Without being bound to a particular theory, therefore, it is speculated that the leveler preferentially adsorbs onto the protrusions from the Cu surface competing with hypophosphite or borohydride reduction on these sites thereby inhibiting electroless deposit growth on the protrusion.

Electroless plating baths for electroless plating of Co and/or Ni such as in a metal capping layer onto a metal-filled interconnect generally comprise a source of deposition ions, a reducing agent, a complexing agent, and a surfactant. The bath is buffered within a certain pH range. Optionally, the bath may also comprise a source of refractory metal ions.

For the deposition of a Co-based alloy, the bath comprises a source of Co ions. Cobalt-based electrolessly deposited alloys have use in a variety of applications. In the context of capping of electrical interconnects, they provide several advantages. They do not significantly alter the electrical conductivity characteristics of Cu. Co provides good barrier and electromigration protection for Cu. Co, which is selected in significant part because it is immiscible with Cu, does not tend to alloy with Cu during assembly or over time during service. The Co ions are introduced into the solution as an inorganic Co compounds such as the hydroxide, chloride, sulfate, or other suitable inorganic salt, or a Co complex with an organic carboxylic acid such as Co acetate, citrate, lactate, succinate, propionate, hydroxyacetate, EDTA or others. $Co(OH)_2$ may be used where it is desirable to avoid overconcentrating the solution with Cl⁻ or other anions. In one embodiment, the Co salt or complex is added to provide about 1 g/L to about 20 g/L of Co²⁺ to yield a Co-based alloy of high Co metal content. In some applications, the Co content in the electroless bath is very low, for example, as low as 1 g/L of Co²⁺.

The bath may instead or additionally comprise a source of Ni ions, which is introduced into the solution as an inorganic Ni salt such as chloride, sulfate, or other suitable inorganic salt, or a Ni complex with an organic carboxylic acid such as Ni acetate, citrate, lactate, succinate, propionate, hydroxyacetate, EDTA or others. In one embodiment, the inorganic Ni salt is Ni(OH)₂. The Ni salt or complex is added to provide about 1 g/L to about 20 g/L of Ni²⁺.

Depending upon the deposition mechanism and the desired alloy, the reducing agent is chosen from either a phosphorus-based reducing agent or a borane-based reducing agent. The reducing agent is discussed more fully below.

The bath further contains one or more complexing agents and buffering agents. The bath typically contains a pH buffer to stabilize the pH in the desired range. In one embodiment, the desired pH range is between about 7.5 and about 10.0. In one embodiment, it is between 8.2 up to around 10, for example between 8.7 and 9.3. Exemplary buffers include, for example, borates, tetra- and pentaborates, phosphates, acetates, glycolates, lactates, ammonia, and pyrophosphate. The pH buffer level is on the order of between about 10 g/L and about 50 g/L.

A complexing agent is included in the bath to keep Co ions in solution. Because the bath is typically operated at a mildly alkaline pH of between about 7.5 and about 10.0, Co²⁺ ions have a tendency to form hydroxide salts and precipitate out of solution. The complexing agents used in the bath are selected from among citric acid, malic acid, glycine, propionic, succinic, lactic acids, DEA, TEA, and ammonium salts such as ammonium chloride, ammonium sulphate, ammonium hydroxide, pyrophosphate, and mixtures thereof. Some complexing agents, such as cyanide, are avoided because they complex with Co ions too strongly and do not allow the deposition to occur. The complexing agent concentration is selected such that the molar ratio between the complexing agent and Co is between about 2:1 and about 4:1, generally. Depending on the complexing agent molecular weight, the level of complexing agent may be on the order of between about 20 g/L and about 120 g/L.

Surfactants may be added to promote wetting of the metal interconnect surface and enhance the deposition of the capping layer. The surfactant serves as a mild deposition inhibitor which can suppress three-dimensional growth to an extent, thereby improving morphology and topography of the film. It can also help refine the grain size, which yields a more uniform coating which has grain boundaries which are less porous to migration of Cu. Cationic surfactants which are film formers are avoided in the composition of the invention. Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, and sulfosuccinates. Exemplary non-ionic surfactants include alkoxylated alcohols, ethoxy/propoxy (EO/PO) block copolymers, alkoxylated fatty acids, glycol and glycerol esters, with polyethylene glycols, and polypropylene glycol/polyethylene glycol currently preferred. The level of surfactant is on the order of between about 0.01 g/L and about 5 g/L.

If desired, the plating bath may also include a refractory metal ion, such as W, Mo, or Re, which functions to increase thermal stability, corrosion resistance, and diffusion resistance. Exemplary sources of W ions are tungsten trioxide, tungstic acid, tungstic acid salts of ammonium, tetramethylammonium and alkali metals, phosphotungstic acid, silicotungstate, other heteropolytungstic acids and other mixtures thereof. For example, one preferred deposition bath contains between about 5 g/L and about 50 g/L of sodium tungstate. Other sources of refractory metal include molybdenum or rhenium trioxides, molibdic or perrhenic acids, molibdic or perrhenic acid salts of ammonium, tetramethylammonium and alkali metals, heteropoly acids of molybdenum or rhenium and other mixtures thereof.

Other additives, as are conventionally known in the art such as stabilizers, rate promoters, and brighteners may also be added. At low concentrations, Pb, Sn, As, Sb, Se, S, and Cd may be added as depositions stabilizers. High concentrations of these ions are avoided, however, because they act as catalytic poisons.

In some applications, the bath must be substantially alkali metal ion free. For example, in microelectronic device applications, such as plating a Co cap over Cu interconnects, the bath must be free of alkali metal ions such as Na and K because these metal ions can lead to the deterioration of Si devices.

The deposition mechanism and the desired alloy dictate the choice of the reducing agent. If an alloy is desired which contains phosphorus, hypophosphite is chosen. If an alloy is desired which contains boron, a borane-based reducing agent is chosen, such as borohydride and dimethyl amine borane (DMAB). Additionally, both phosphorous and a borane-based reducing agents may be added to the plating bath.

Among the phosphorus-based reducing agents, hypophosphite is a preferred reducing agent in electroless plating films because of its low cost and docile behavior as compared to other reducing agents. When hypophosphite is chosen as the reducing agent, the finished alloy contains phosphorus. The reaction mechanism proposed to explain this phenomenon is shown:

$$Ni^{2+}+4H_2PO_2^-+H_2O=Ni^0+3H_2PO_3^-+H^++P^0+\tfrac{1}{2}H_2$$

According to the reaction mechanism, the plating solution requires four moles of $H_2PO_2^-$ to reduce 1 mole of $Ni^{2+}$ into the nickel alloy. As noted in Mallory and Hajdu, pp. 62-68, the molar ratio of Co or Ni ions to hypophosphite ions in the plating solution is between 0.25 to 0.60, preferably between 0.30 and 0.45, for example. To ensure that a sufficient concentration of hypophosphite is present in the plating bath, the hypophosphite salt is added in an initial concentration of about 2 g/L to about 30 g/L, for example about 21 g/L.

Hypophosphite reduces the metal ion spontaneously only upon a limited number of substrates, including: Co, Ni, Rh, Pd, and Pt. Not included in this list is copper, a particular metal of interest for its use in filling interconnect features such as vias and trenches in microelectronic devices. For hypophosphite reduction over a copper substrate, the copper surface must first be activated, for example, by seeding with the metal to be deposited (Co or Ni) or by a catalyst such as Pd, or by treating the surface with a strong reducing agent such as DMAB.

Other preferred reducing agents include the borane-based reducing agents, such as borohydride, dimethyl amine borane (DMAB), diethyl amine borane (DEAB), pyridine borane, and morpholine borane. To ensure that a sufficient concentration of reducing agent is present in the plating bath, e.g., dimethyl amine borane is added in an initial concentration of about 0.5 g/L to about 10 g/L, for example about 4 g/L.

When a borane-based reducing agent is chosen, elemental boron becomes part of the plated alloy. A reaction mechanism explaining this phenomenon with respect to dimethyl amine borane is shown:

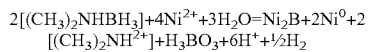

A reaction mechanism explaining this phenomenon with respect to borohydride is shown:

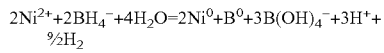

According to the reaction mechanism, the plating solution requires 2 moles of $BH_4^-$ to reduce 2 moles of $Ni^{2+}$ into the nickel alloy.

Unlike hypophosphite, plating solutions with borane-based reducing agents do not need a copper surface activation step. Instead, the reducing agent autocatalyzes reduction of the metal ion onto the copper surface.

As a consequence of the oxidation of the reducing agent, P or B co-deposits with the Co or Ni. An effect of these elements in the deposit is to reduce grain size, inhibit crystalline structure formation, and enhance amorphousness, which can render the microstructure more impervious to Cu electromigration. For example, Co—W—B with high W content has a phase which appears to approach overall amorphousness. Without being bound to a particular theory, it is believed that the presence of refractory metal together with B and P improves the barrier properties by filling in the grain boundaries of the crystalline structure of the deposit.

Employing the foregoing baths, a variety of alloys can be deposited; for example diffusion barrier layers include Co—W—P, Co—W—B, Co—W—B—P, Co—B—P, Co—B, Co–Mo—B, Co—W—Mo—B, Co—W—Mo—B—P, and Co-Mo—P etc.

According to the practice of electroless deposition, a layer of Co and/or Ni deposit may be deposited by exposure of the electroless plating compositions to, for example, a patterned silicon substrate having vias and trenches, in which a metal layer, such as Cu, has already filled into the vias or trenches. This exposure may comprise dip, flood immersion, spray, or other manner of exposing the substrate to a deposition bath, with the provision that the manner of exposure adequately achieves the objectives of depositing a metal layer of the desired thickness and integrity.

The electroless plating compositions according to the present invention may be used in conventional continuous mode deposition processes. In the continuous mode, the same bath volume is used to treat a large number of substrates. In this mode, reactants must be periodically replenished, and reaction products accumulate, necessitating periodic removal of the plating bath. Alternatively, the electroless plating compositions according to the present invention are suited for so-called use and dispose deposition processes. In the use and dispose mode, the plating composition is used to treat a substrate, and then the bath volume is directed to a waste stream. Although this latter method is more expensive, the use and dispose mode requires no metrology, that is, measuring and adjusting the solution composition to maintain bath stability is not required.

For auto-catalyzation of the electroless deposition, borane-based reducing agents may be employed such as an alkylamine borane reducing agent, for example DMAB, DEAB, morpholine borane, mixtures thereof, or mixtures thereof with hypophosphite. Oxidation/reduction reactions involving the borane-based reducing agents and Co and/or Ni deposition ions are catalyzed by Cu. In particular, at certain plating conditions, e.g., pH & temperature, the reducing agents are oxidized in the presence of Cu, thereby reducing the Co or Ni ions to metal which deposits on the Cu. The process is substantially self-aligning in that the metal is deposited essentially only on the Cu interconnect. However, conventional electroless plating baths deposit a Co and/or Ni alloy that amplifies the roughness of the underlying Cu interconnect. If hydrazine is added to the plating solution, as in the present invention, the electroless plating bath deposits a smooth and level Co and/or Ni capping layer.

As an alternative, certain embodiments of the invention employ an electroless deposition process which does not employ a reducing agent which renders Cu catalytic to metal deposition. For such processes a surface activation operation is employed to facilitate subsequent electroless deposition. A currently preferred surface activation process utilizes a Pd immersion reaction. Other known catalysts are suitable and include Rh, Ru, Pt, Ir, and Os. Alternatively, the surface may be prepared for electroless deposition by seeding as with, for example, Co seeding deposited by electroless deposition, PVD, CVD, or other technique as is known in the art.

The following examples further illustrate the invention.

EXAMPLE 1

According to the present invention, a first electrolees plating bath was prepared comprising the following components:

23 g/L of $CoSO_4.7H_2O$
21 g/L of $Nah_2PO_2.H_2O$
31 g/L of $Ha_3BO_3$
100 g/L of $Na_3C_6H_4O_7.2 H_2O$
30 g/L $Na_2WO_4.2H_2O$
0.05 g/L of RHODAFAC RE610(manufactured by Rhone-Poulenc)
0.01 g/L of Hydrazine Balance of DI water to 1 L This bath was prepared at room temperature. The components were added according to the following steps:
1. 23 g of $CoSO_4.7H_2O$ dissolved in water.
2. 100 g of $Na_3C_6H_4O_7.2H_2O$ added to complex $Co^{2+}$ions.
3. Remaining ingredients added, except hydrazine, in no particular order.
4. pH adjusted to about 9.0 with TMAH.
5. Hydrazine added.

Solution is filtered to remove any solids.

For comparison, a second electroless plating bath was prepared according to the same sequences of steps, having the same components except for the hydrazine-based leveling agent. The bath had the following components:

23 g/L of $CoSO_4.7H_2O$
21 g/L of $NaH_2PO_2.H_2O$
31 g/L of $H_3BO_3$
100 g/L of $Na_3C_6H_4O_7.2H_2O$
30 g/L $Na_2WO_4.2H_2O$
0.05 g/L of RHODAFAC RE610(manufactured by Rhone-Poulenc)
Balance of DI water to 1 L This bath was prepared at room temperature, and adjusted to pH of about 9.0 with TMAH.

EXAMPLE 2

According to the present invention, ternary alloys consisting of Co—W—P were electrolessly deposited from the electroless plating baths of Example 1 onto a patterned copper silicon substrate.

The starting substrate was made of silicon. The substrate had exposed patterned Cu wires embedded in Ta/TaN stack barrier surrounded with interlevel dielectric (ILD) made of $SiO_2$-based material. Cu features protruding over ILD about 33 Angstroms had a roughness of 5 Angstroms.

The patterned copper silicon substrate was exposed to a preclean solution that may be, for example, 10% sulfuric acid solution to remove post-CMP inhibitor residues, copper (II) oxide layer, and post-CMP slurry particles from ILD. It was then rinsed in deionized (DI) water, and subsequently activated with Pd.

To plate the alloy, the substrate was immersed in the Co—W—P electroless deposition solutions of Example 1. To illustrate the advantages of the hydrazine-based leveling agent according to the present invention, the substrate was immersed into an electroless plating bath which contained a hydrazine-based leveling agent. The baths were kept at 75° C. to 85° C., at a pH of 8.5-10, and plating occurred for 1 minute.

Under experimental conditions, this bath plated a 125 Angstrom thick Co—W—P alloy layer onto the copper substrate with a surface roughness of 6 Angstroms. This corresponded to a surface roughness of 4.8% of the total thickness of the Co—W—P alloy layer. It can readily be appreciated that the addition of hydrazine caused the bath to plate an alloy layer whose surface roughness was approximately equal to the surface roughness of the underlying copper substrate layer, which was 5 Angstroms. However, the Co—W—P alloy layer was 125 Angstroms thick, which was about four times the thickness of underlying copper substrate. Therefore, the plating bath which contains hydrazine deposited a Co—W—P layer which closely maintained the absolute surface roughness of the underlying Cu layer, but with a layer that was four times as thick as the underlying copper layer.

For comparison, the substrate was immersed in the comparative, hydrazine-free Co—W—P electroless deposition solution of Example 1.

After plating in this bath, a 171 Angstrom thick Co—W—P alloy layer was deposited onto the copper substrate with a surface roughness of 19 Angstroms. This corresponded to a surface roughness of 11% of the total thickness of the Co—W—P alloy layer. In this example, the electroless plating bath deposited an alloy layer whose topography amplified the surface roughness of the underlying patterned copper silicon substrate. The surface roughness of the underlying copper substrate was only 5 Angstroms. The conventional plating bath deposited a Co—W—P alloy layer with a surface roughness of 19 Angstroms. Therefore, the conventional bath amplified the roughness of the underlying copper layer by nearly four times.

EXAMPLE 3

Figure 2:
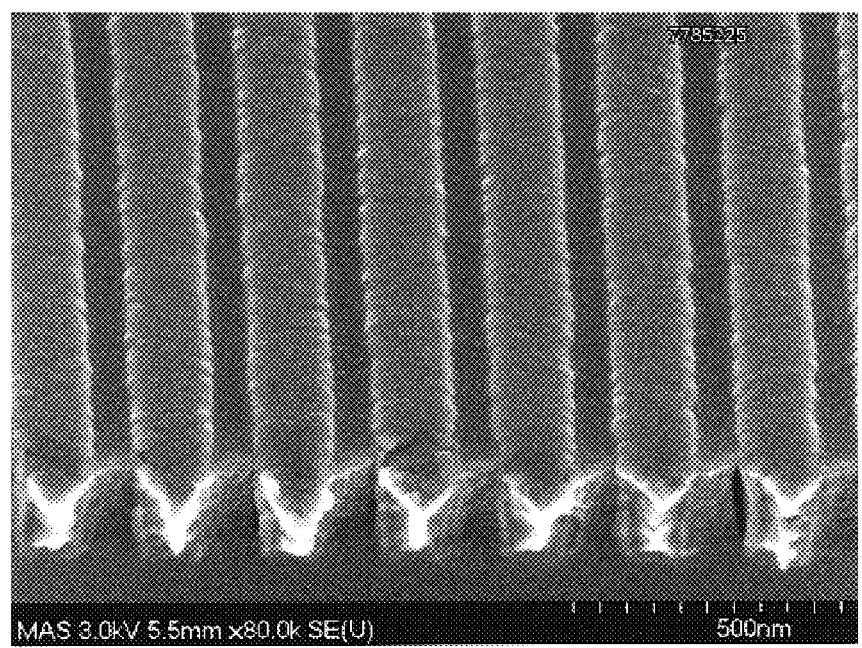
FIG. 2 is a SEM photograph of a Co—W—P diffusion protection layer of the invention magnified 80,000×.

The difference in surface roughness achieved in a Co—W—P layer deposited from an electroless plating bath comprising a hydrazine-based leveling agent in accordance with the invention as compared to a plating bath without hydrazine can be seen by referring to FIGS. 1 and 2. FIGS. 1 and 2 are SEM photographs of Co—W—P capping layers at a magnification of 80,000×. The smooth surface of FIG. 2 exhibits the Co—W—P layer deposited in accordance with the present invention, i.e., a bath containing hydrazine. FIG. 1 exhibits the Co—W—P layer deposited by a plating bath that does not contain hydrazine.

A Co—W—P capping layer that exhibits the surface smoothness and planarity of the layer shown in FIG. 2 is smooth enough as deposited to function as a diffusion barrier layer over a Cu interconnect feature, with substantially reduced risk of electrical short either immediately after deposition or during the service life of the interconnect feature.

The Co—W—P capping layer of FIG. 1 has a rougher morphology that may have a greater risk of nodule growth causing an electrical short of the interconnect structures immediately after deposition, and shortening the service life of the interconnect feature.

EXAMPLE 4

With reference to Table 1, the results of several immersions are shown. Alloy 1 indicates the surface roughness for the Cu-filled interconnects in the underlying patterned wafer, which was approximately 5 Angstroms.

TABLE 1

Surface roughness of the Co—W—P alloy layer as a function of plating bath components

| Alloy | Layer | Thickness, Å | RMS, Å | RMS vs Th., % | Analysis |
|---|---|---|---|---|---|
| 1 | Cu | 34 | 5 | | AFM |
| 2 | CoWP (no additives) | 147.5 | 17.2 | 11.7 | AFM |
| 3 | CoWP (no additives) | 111.3 | 24 | 21.6 | AFM |
| 4 | CoWP with additives | 153.8 | 17.7 | 11.5 | AFM |
| 5 | CoWP with additives | 194.7 | 23.8 | 12.2 | AFM |
| 6 | CoWP with additives | 169.7 | 22.8 | 13.4 | AFM |
| 7 | CoWP with additives | 158.3 | 28.3 | 17.8 | AFM |
| 8 | CoWP with additives | 156.9 | 21.5 | 13.7 | AFM |
| 9 | CoWP with additives | 176.6 | 20.3 | 11.5 | AFM |
| 10 | CoWP with additives | 170.9 | 18.9 | 11.1 | AFM/SEM |
| 11 | CoWP with additives | 158.6 | 18.4 | 11.6 | AFM |
| | | | | 13.6 (average) | |
| 12 | CoWP with Hydrazine | 140.8 | 6.7 | 4.8 | AFM |
| 13 | CoWP with Hydrazine | 179.2 | 6.4 | 3.6 | AFM |
| 14 | CoWP with Hydrazine | 191.6 | 8.7 | 4.5 | AFM/SEM |
| 15 | CoWP with Hydrazine | 123.1 | 7.2 | 5.8 | AFM |
| | | | | 4.6 (average) | |

Alloys 2 through 11 indicate Co—W—P alloy layers plated from plating baths which were free of the hydrazine-based leveling agent. In each case, these baths plated alloy layers with surface roughness that amplified the roughness of the underlying copper, by at least three and up to nearly six times. The average surface roughness of 21.3 Angstroms was more than 4 times the surface roughness of the underlying copper silicon substrate, which was 5 Angstroms.

Alloys 12 through 15 were plated by a plating bath which contained a hydrazine-based leveling agent. In these alloys, the surface roughness of the copper layer was approximately maintained by the Co—W—P alloy layer. This is indicated by an average surface roughness of 7.2 Angstroms for the Co—W—P alloy layers as compared to a surface roughness of 5 Angstroms for the copper. The Co—W—P alloy layers were, however, on average 4.7 times thicker than the underlying copper layer.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method for electrolessly depositing a cobalt-based alloy selectively onto a metal-based substrate in manufacture of microelectronic devices, the method comprising:
    contacting the metal-based substrate with an electroless deposition composition to thereby electrolessly deposit the cobalt-based alloy selectively onto the metal-based substrate, wherein:
    the electroless deposition composition has a pH between about 7.5 and about 10;
    the electroless deposition composition comprises a) a source of cobalt deposition ions b) a source of hypophosphite for use as a reducing agent for reducing the depositions ions to metal onto the substrate, c) a hydrazine-based leveling agent present at a concentration to yield a hydrazine concentration in the electroless deposition composition from about 1 ppm to about 100 ppm; and d) a source of tungsten ions; and
    the cobalt-based alloy comprises cobalt metal, elemental phosphorus, and tungsten metal.

2. The method of claim 1 wherein the electroless deposition composition has a pH from about 8.7 to about 9.3.

3. The method of claim 1 wherein the hydrazine-based leveling agent is selected from the group consisting of hydrazine and derivatives of hydrazine, and wherein the hydrazine and derivatives of hydrazine introduce free hydrazine upon dissolution into the electroless deposition composition.

4. The method of claim 1 wherein the hydrazine-based leveling agent is selected from the group consisting of hydrazine hydrate, hydrazine sulfate, hydrazine chloride, hydrazine bromide, hydrazine dihydrochloride, hydrazine dihydrobromide, and hydrazine tartrate.

5. The method of claim 1 wherein the hydrazine-based leveling agent is a derivative of hydrazine wherein the derivative of hydrazine forms hydrazine as a reaction product in the electroless deposition composition.

6. The method of claim 1 wherein the hydrazine-based leveling agent is selected from the group consisting of 2-hydrazinopyridine, hydrazobenzene, phenyl hydrazine, hydrazine N,N diacetic acid, 1,2-diethylhydrazine, monomethylhydrazine, 1,1-dimethylhydrazine, 1,2-dimethylhydrazine, 4-hydrazinobenzenesulfonic acid, hydrazinecarboxylic acid, 2-hydrazinoethanol, semicarbazide, carbohydrazide, aminoguanidine hydrochloride, 1,3-diaminoguanidine monohydrochloride, and triaminoguanidine hydrochloride.

7. The method of claim 1 wherein the hydrazine-based leveling agent is present at a concentration to yield a hydrazine concentration in the electroless deposition composition from about 10 ppm to about 20 ppm.

8. A method for electrolessly depositing a cobalt-based alloy selectively onto a metal interconnect feature located in a $SiO_2$ or low k dielectric substrate, the method comprising:
    contacting the substrate with an electroless deposition composition to thereby electrolessly deposit the cobalt-based alloy selectively onto the metal interconnect feature, wherein:
    the electroless deposition composition comprises a) a source of cobalt deposition ions b) a source of hypophosphite for use as a reducing agent for reducing the depositions ions to metal onto the substrate, c) a hydrazine-based leveling agent present in a concentration to yield a hydrazine concentration in the electroless deposition composition from about 1 ppm to about 100 ppm; and d) a source of tungsten ions; and
    the cobalt-based alloy comprises cobalt metal, elemental phosphorus, and tungsten metal.

9. The method of claim 8 wherein the electroless deposition composition has a pH from about 7.5 to about 10.0.

10. The method of claim 8 wherein the metal interconnect feature is a copper interconnect feature.

11. The method of claim 8 wherein the substrate is contacted with the electroless deposition composition by immersing the substrate into the electroless deposition composition.

12. The method of claim 8 wherein the electroless deposition composition has a pH from about 8.7 to about 9.3.

13. The method of claim 8 wherein the hydrazine-based leveling agent is selected from the group consisting of hydrazine and derivatives of hydrazine, and wherein the hydrazine and derivatives of hydrazine introduce free hydrazine upon dissolution into the electroless deposition composition.

14. The method of claim 8 wherein the hydrazine-based leveling agent is selected from the group consisting of hydrazine hydrate, hydrazine sulfate, hydrazine chloride, hydrazine bromide, hydrazine dihydrochloride, hydrazine dihydrobromide, and hydrazine tartrate.

15. The method of claim 8 wherein the hydrazine-based leveling agent is a derivative of hydrazine wherein the derivative of hydrazine forms hydrazine as a reaction product in the electroless deposition composition.

16. The method of claim 8 wherein the hydrazine-based leveling agent is selected from the group consisting of 2-hydrazinopyridine, hydrazobenzene, phenyl hydrazine, hydrazine N,N diacetic acid, 1,2-diethylhydrazine, monomethylhydrazine, 1,1-dimethylhydrazine, 1,2-dimethylhydrazine, 4-hydrazinobenzenesulfonic acid, hydrazinecarboxylic acid, 2-hydrazinoethanol, semicarbazide, carbohydrazide, aminoguanidine hydrochloride, 1,3-diaminoguanidine monohydrochloride, and triaminoguanidine hydrochloride.

17. The method of claim 8 wherein the hydrazine-based leveling agent is present at a concentration to yield a hydrazine concentration in the electroless deposition composition from about 10 ppm to about 20 ppm.

* * * * *